United States Patent [19]

Blickhan et al.

[11] Patent Number: 5,483,103

[45] Date of Patent: Jan. 9, 1996

[54] MEANS FOR CLAMPING A SEMI-CONDUCTOR TO A SUPPORT

[75] Inventors: Joseph D. Blickhan; David K. Bonds; Robert J. Crockett; James E. Mazurek; Dennis J. Milfs, all of Quincy, Ill.

[73] Assignee: Harris Corporation, Melbourne, Fla.

[21] Appl. No.: 201,612

[22] Filed: Feb. 24, 1994

[51] Int. Cl.⁶ .................................................. H01L 23/34
[52] U.S. Cl. ........................... 257/718; 257/719; 257/726
[58] Field of Search ..................................... 257/718, 719, 257/726, 712

[56] References Cited

U.S. PATENT DOCUMENTS

| | | | |
|---|---|---|---|
| 4,591,896 | 5/1986 | Kikuchi | 257/726 |
| 4,853,762 | 8/1989 | Ewer et al. | 357/79 |
| 4,908,695 | 3/1990 | Morihara et al. | 257/719 |
| 5,251,098 | 10/1993 | Schmidt | 257/718 |

Primary Examiner—William Mintel
Assistant Examiner—Roy Potter
Attorney, Agent, or Firm—Tarolli, Sundheim & Covell

[57] ABSTRACT

Apparatus is presented herein for resiliently clamping at least one semi-conductor device to a support having an upper surface and wherein the semi-conductor device includes a housing having upper and lower spaced-apart relatively flat surfaces interconnected by an upstanding cylindrical wall. A leveller is provided having an upper dome-shaped contact surface and a lower surface having a circular-shaped first recess formed therein. The first recess is shaped and is of sufficient size to receive the upper portion of the housing including the upper surface thereof and a portion of the height of the cylindrical wall while the lower surface of the housing is located on the upper surface of the support. An elongated spring overlies and is resiliently biased toward and engages the dome-shaped contact surface of the leveller. A fastener secures the spring to the support such that the spring exerts a resilient force against the dome-shaped contact surface of the leveller to resiliently clamp the semi-conductor device against the upper surface of the support.

9 Claims, 2 Drawing Sheets

MEANS FOR CLAMPING A SEMI-CONDUCTOR TO A SUPPORT

FIELD OF THE INVENTION

The present invention relates to the art of securing or otherwise clamping semi-conductor devices to a support, such as a heat sink.

BACKGROUND OF THE INVENTION

It is known in the prior art to mount semi-conductors to heat sinks which serve to dissipate heat from the semi-conductors during operation. It is important that the semi-conductors be firmly attached to a heat sink while at the same time the means for attaching the semi-conductors to the heat sink must be removable in the event that the semi-conductors must be replaced.

It is, therefore, important to provide removable semi-conductor clamping means so that the semi-conductor may be removed and replaced with a new semi-conductor.

One means known in the art for clamping or securing one or more semiconductors to a heat sink is to place an aluminum bar over the top of one or more semi-conductors and then secure the aluminum bar to the heat sink by use of a fastening means, taking the form of a screw. The screw extends through a hole in the aluminum bar and is threaded into the heat sink by applying torque to the screw. Several problems have been noted with the use of such a clamping mechanism. If the top and bottom surfaces of the semi-conductor device or package are not parallel to each other, then an uneven distribution of pressure will result between the clamp bar and the semi-conductor and between the semi-conductor and the heat sink. This may lead to a cracked semi-conductor housing, and/or less than optimal thermal performance. This problem becomes more exaggerated in situations where multiple semi-conductor packages are held down by such a clamping mechanism and wherein the semiconductor packages are of varying heights and, hence, parallelism is not obtained with a single clamp bar extending over a plurality of such semi-conductor packages.

Another problem encountered with such clamping mechanisms as noted above is the unpredictable and unrepeatable torques exerted by the screw employed to hold the overlying clamp bar down against the upper surfaces of the semi-conductor packages. Thus, since the pressure exerted by the clamping mechanism to hold the semi-conductor packages down against the heat sink depends in large measure on the torque applied to the screw, different semi-conductors held down by different clamping mechanisms constructed in the same manner will provide different levels of hold-down pressure, since each clamping mechanism will exert a hold-down pressure dependent upon the torque applied to its screw. This will result in different levels of hold-down pressures for different semi-conductors mounted to the same or different heat sinks.

The U.S. Patent to Ewer et al. U.S. Pat. No. 4,853,762 discloses spring clamps for resiliently clamping a pair of semi-conductor devices to a support, such as a heat sink. A compression disk overlies each semi-conductor device and has a dome-shaped upper surface against which a spring exerts downwardly extending forces so that the compression disk, in turn, holds the semi-conductor devices against the heat sink. Each spring overlies and contacts one compression disk and each spring is secured to the heat sink by means of two screws which extend down into and are threaded into the heat sink.

The clamping mechanism disclosed in the Ewer et al. patent, supra, depends on the height of the screws to determine the amount by which the associated spring is deflected. Depending upon the amount of torque applied, the screws may be over or under tightened. Moreover, each overlying spring in the Ewer et al. patent is deflected in a downward direction raising the possibility that the spring may interfere with other devices and may interfere with electrical connections and the like. Moreover, it is noted that Ewer et al. requires two springs to hold down two semi-conductor devices and each spring requires two screws to secure the spring to the heat sink. It would be more desirable to employ a single spring to hold down two devices wherein the spring bends upwardly to minimize interference with electrical connections or other devices and wherein a spacer or the like is provided to prevent overtorqueing of the screws to thereby avoid damaging the semi-conductor packages.

It is further noted that each compression disk employed in the Ewer et al. patent, supra, has a flat lower surface and rests on top of a flat upper surface of a semi-conductor device thereby distributing forces evenly to the top of the semi-conductor device on which it is placed. If such compression disks are placed over a conventional "pill" type semi-conductor package which takes the form of upper and lower flat relatively parallel circular-shaped surfaces interconnected by a cylindrical wall, such forces distributed by the compression disk may cause the central portion of the upper surface of the semi-conductor packages to be damaged and, possibly, collapse. Moreover, the use of such compression disks having a flat lower surface provides no means for locating and retaining the semi-conductor "pill" package during assembly.

SUMMARY OF THE INVENTION

In accordance with the present invention, apparatus is provided for resiliently clamping a semi-conductor device to a support and wherein the semi-conductor device takes the form of a housing having upper and lower spaced apart relatively parallel flat surfaces interconnected by an upstanding wall. A leveller is provided having an upper dome-shaped contact surface and a lower surface. The lower surface has a recess formed therein. The recess is shaped and is of sufficient size to receive the upper portion of a semi-conductor device including the upper surface thereof and a portion of the height of the upstanding wall. The lower surface of the semi-conductor device is located on an upper surface of the support. A spring overlies and is resiliently biased toward and engages the dome-shaped contact surface of the leveller. A fastening mechanism, such as a screw, is provided for securing the spring to the support in such a manner that the spring exerts a resilient force against the dome contact surface of the leveller to resiliently clamp the semi-conductor device against the upper surface of the support.

In accordance with another aspect of the invention, the recess in the lower surface of the leveller has a second recess formed therein to define a shoulder therebetween which overlies the upstanding wall of a received semi-conductor device. Consequently, the clamping forces provided by the spring are directed outwardly and downwardly against the periphery of the upstanding walls of the semi-conductor device.

In accordance with a still further aspect of the present invention, a spacer is interposed between the upper surface of the support and the spring for spacing the spring a predetermined distance above the support and wherein the fastening mechanism takes the form of a screw which extends through the spring and a through a bore in the spacer and is threaded into the support,

BRIEF DESCRIPTION OF THE DRAWINGS

The foregoing and other objects of the invention will become more readily apparent from the following description of the preferred embodiment of the invention as taken in conjunction with the accompanying drawings which are a part hereof and wherein.

DESCRIPTION OF PREFERRED EMBODIMENT

Reference is now made to the drawings wherein the showings are for purposes of illustrating a preferred embodiment of the invention only, and not for the purpose of limiting same.

Reference is now made to the drawings which illustrate a resilient clamp assembly 10 which serves to resiliently clamp a pair of semi-conductor devices 12 and 14 to a support, taking the form of a heat sink 16.

Figure 2:
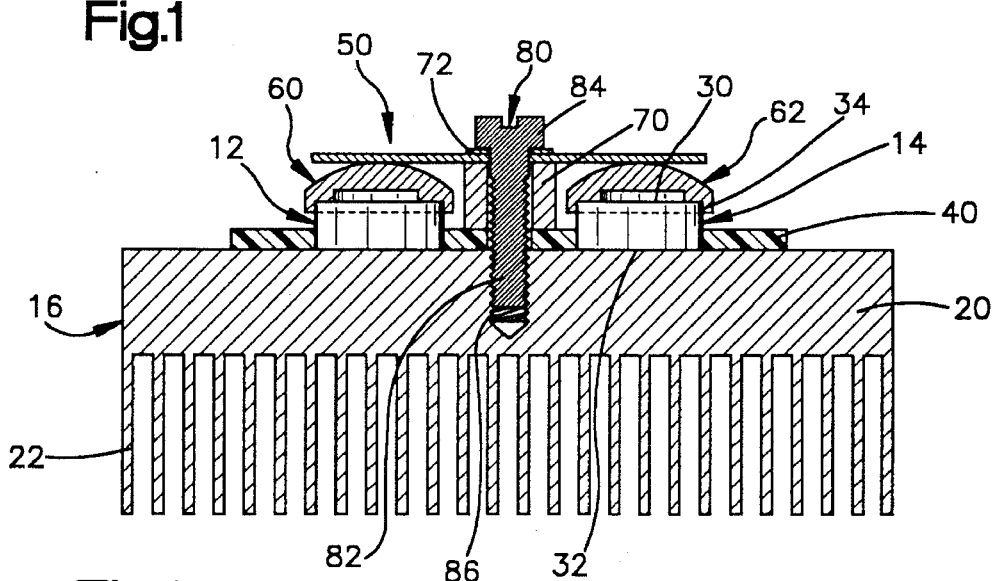
FIG. 2 is a sectional view taken along line 2—2 looking in the direction of the arrows in FIG. 1.

The heat sink 16 is conventional in the art and may take the form of a relatively flat, rectangular-shaped plate 20 having a uniform thickness which may be on the order of three quarters of an inch and which is provided with a plurality of vertically extending cooling fins 22 which are spaced apart from each other, as is best shown in FIG. 2. The heat sink may be made of various materials, including aluminum.

The semi-conductor devices 12 and 14 may take various forms, but in the embodiment described herein, it is contemplated that each semi-conductor device take the form of an FET (field effect transistor) power transistor and which is packaged in what is frequently referred to as a "pill" device. As such, there are no flanges extending from the pill housing for use in mounting purposes. Instead, each of the semi-conductor devices 12 and 14 takes the form of a housing having an upper circular-shaped surface 30 and a lower circular-shaped surface 32 which are interconnected by means of a cylindrical-shaped wall 34. Electrical conductors 36 and 38 extend horizontally outward from each pill for providing electrical connections to other circuitry. The lower surface 32 of each pill is typically constructed of a metallic material to provide good heat transfer to the heat sink 16. The cylindrical wall 34 and the upper surface 30 are typically constructed of a ceramic material. The upper surface 30 may therefore be easily damaged and perhaps cracked if downward forces 10 are exerted centrally of the upper surface as opposed to being exerted along the circumferential or peripheral area which overlies the cylindrical wall 34.

Figure 1:
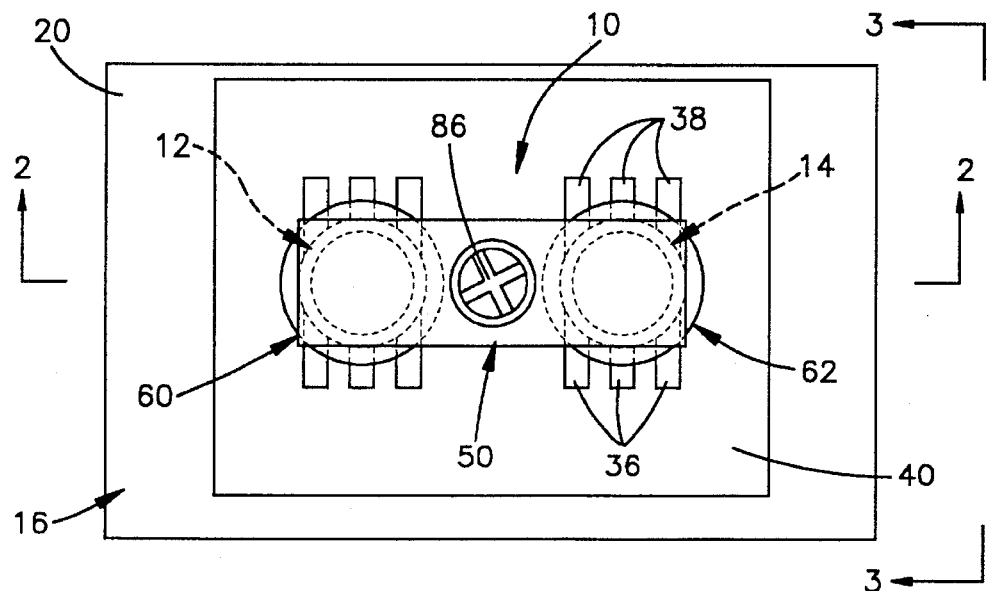
FIG. 1 is a top view illustrating a resilient clamp securing a pair of semi-conductor devices to a support taking the form of a heat sink and constructed in accordance with the present invention.
Figure 3:
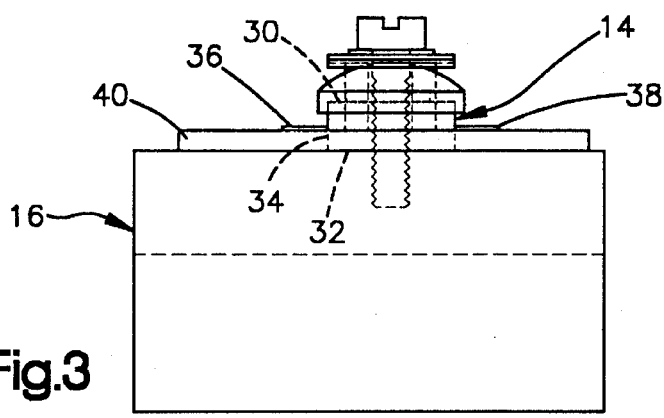
FIG. 3 is a side view taken along line 3—3 looking in the direction of the arrows in FIG. 1.

As shown in FIGS. 1, 2 and 3, each of the semi-conductor devices 12 and 14 is mounted so that its lower surface 32 makes engagement with the upper surface of the heat sink 16. In this context, it will be noted that a printed circuitboard 40 is secured to the upper surface of the heat sink 16 as with a suitable bonding material. The printed circuitboard 40 is provided with a pair of circular-shaped apertures, each of sufficient size to receive one of the semi-conductor devices 12 and 14. This permits the semi-conductor devices to be properly positioned and rest on the upper surface of the heat sink 6.

The spring clamp assembly 10 includes a leaf spring 50 (best shown in FIGS. 4 and 5) a pair of domed levellers 60 and 62 (best shown in FIGS. 6 and 7), a spacer 70, a washer 72 and a screw 80.

Figure 4:
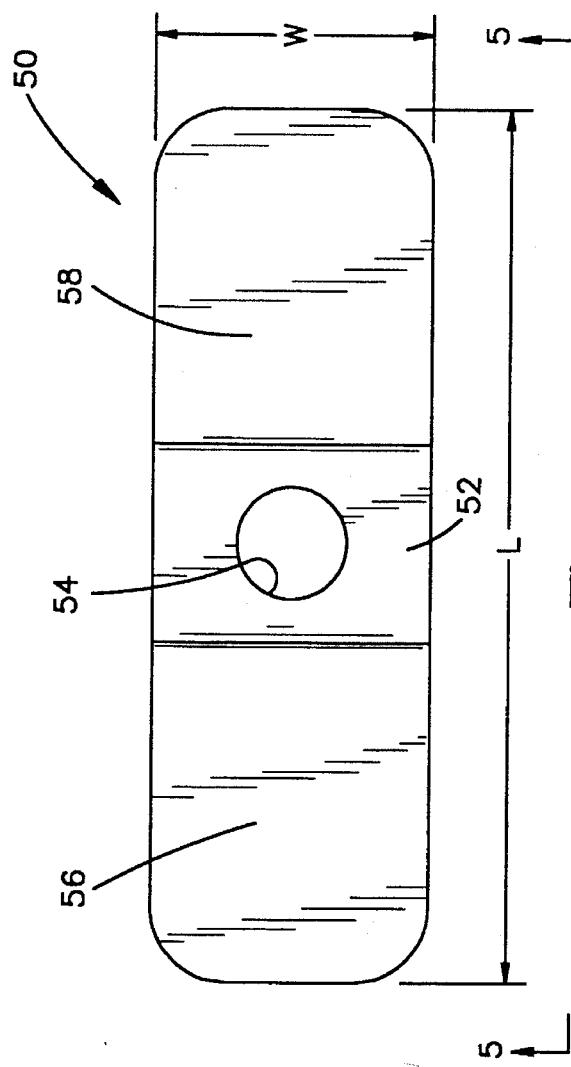
FIG. 4 is a plan view illustrating the clamping spring in accordance with the invention.
Figure 5:
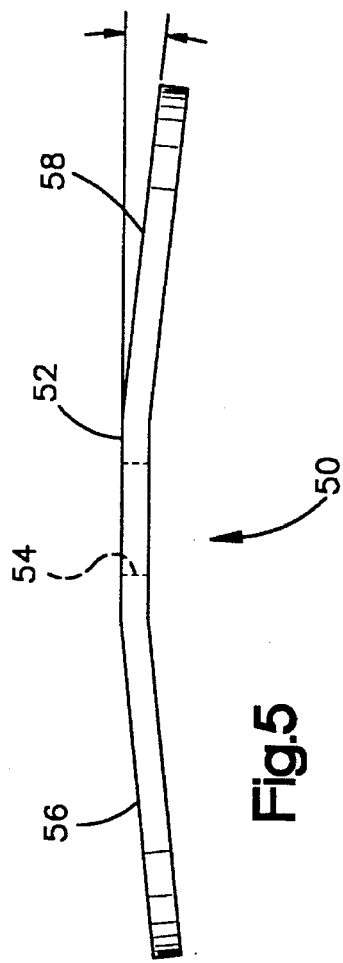
FIG. 5 is a view taken along line 5—5 looking in the direction of the arrows in FIG. 4.

Reference is now made to FIGS. 4 and 5 which illustrate the leaf spring 50 in greater detail. The leaf spring 50 may be constructed of a suitable metal, such as beryllium copper. The leaf spring is heat treated in conjunction with its manufacture. The leaf spring is of a length L on the order of 1.5 inches and has a width W on the order of 0.500 inches. Initially, the leaf spring is flat and has a central flat portion 52 which has a length on the order of 0.375 inches and is provided with a central aperture 54 which extends therethrough with the aperture having a diameter on the order of 0.172 inches. The aperture is of sufficient size to receive the shank of screw 80 to be described hereinafter. The leaf spring has two leaf portions 56 and 58 which are bent downwardly from portion 52 with each leaf being bent with respect to portion 52 by an angle on the order of 11°. The leaf spring has a thickness on the order of 0.032 inches. The angle of the bend of leaf portions 56 and 58 relative to central portion 52 is chosen so as to provide a spring force for each leaf portion on the order of 30 to 50 pounds exerted against the top of levellers 60 and 62. The dimensions and angles cited thus far have been employed in an embodiment of the invention that was constructed and tested. Other dimensions may be employed within the scope of the invention.

Figure 6:
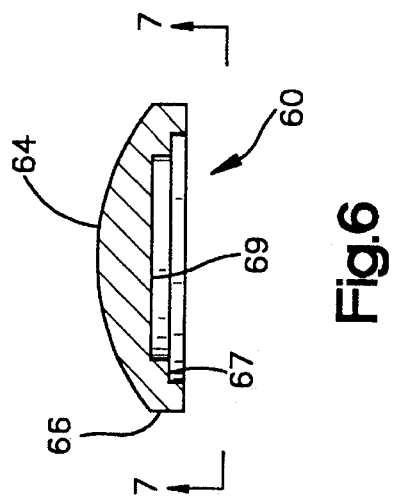
FIG. 6 is a sectional, elevation view illustrating a leveller in accordance with the present invention.
Figure 7:
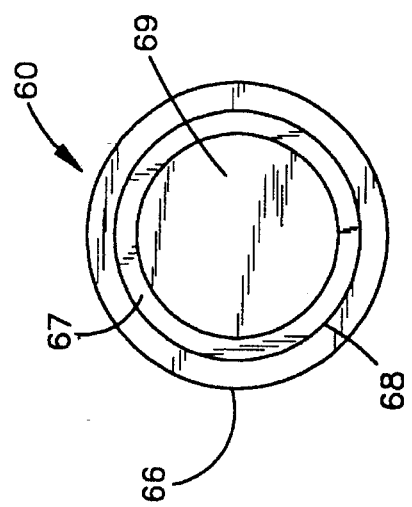
FIG. 7 is a view taken along line 7—7 looking in the direction of the arrows in FIG. 6.

The domed levellers 60 and 62 may be constructed of metal, such as brass. The levellers are identical and each is constructed as illustrated with respect to leveller 60 in FIGS. 6 and 7 to which attention is now directed. As shown in FIGS. 6 and 7, the domed leveller 60 has a domed or conically-shaped upper surface 64 and which has a radius on the order of 0.5 inches. As seen in FIG. 7, the leveller is circular in shape and has an outer circumference 66 having a diameter on the order of 0.615 inches. The circumference 66 extends vertically upward between the bottom of the leveller and the domed surface 64 for a distance which may be on the order of 0.07 inches.

The lower surface of the leveller 60 is provided with a recess 67 having an outer diameter 68 which is coaxial with the outer diameter 66. This recess 67 has a depth on the order of 0.03 inches.

A second recess 69 is formed in recess 67 so that the recess 67 becomes an annular shoulder or ring surface. Recess 69 has a depth from the lower surface of leveller 60 on the order of 0.070 inches. Also, the diameter of recess 67 is on the order of 0.515 inches, whereas the diameter of recess 69 is on the order of 0.41 inches.

Recess 67 serves to receive one of the semi-conductor devices 12 or 14. The outer cylindrical wall 34 of the semi-conductor device is of a diameter slightly less than that of recess 67 so that it may easily be received within the recess. Moreover, the recess 67 serves as an annular ring or flange which bears down against the upper peripheral edge of the cylindrical side wall 34 when the leveller is in place on the semi-conductor device. When so positioned, there is an air pocket just above the central portion of the semi-conductor device so that the surface of recess 69 does not bear down against the central portion of the semi-conductor device. This prevents damage to the semi-conductor device.

The spacer 70 serves to correctly position the leaf spring above the heat sink 16. The spacer may be made of metal, such as aluminum, and takes the form of a cylindrical tubular-shaped member having a bore extending axially therethrough with the bore being sufficient to slidably receive the threaded shank 82 of screw 80.

Above the spring 50 and just below the head 84 of screw 80, there is provided a washer 72. The head 84 of screw 80 has conventional tool receiving slots 86 therein for receiving a suitable screwdriver for tightening or untightening the screw. The shank 82 of the screw is threaded and is threadably received in a threaded bore 86 provided in the heat sink 16.

In assembly, the semi-conductor devices 12 and 14 are placed on the heat sink by positioning the devices in the recesses formed in the printed circuitboard 40 so that the flat lower surface 32 of each semi-conductor device is mounted flush against the upper surface of the heat sink. The levellers 60 and 62 are then positioned on top of the semi-conductor devices so that the annular shoulder 67 (FIG. 6) of each domed leveller rests on top of an associated semi-conductor device with the shoulder overlying the upstanding cylindrical wall of the semi-conductor device. This insures that forces acting downwardly will be directed to the outer periphery of each semi-conductor device so as to avoid damaging the central portion thereof.

Spring 50 rests on top of spacer 70. The washer 72 is placed on top of the spring. Screw 80 has its threaded shank 82 extending through the washer 72, aperture 54 in the spring and, thence, through the bore in spacer 70 to threadingly engage the threaded bore 86 in the heat sink 16. The screw 80 is tightened against the spacer 70 so as to insure a proper height of the spring 50 above the semi-conductor devices 12 and 14. When proper loading has been achieved, the spring will be approximately flat as portions 56 and 58 are bent upwardly, as is indicated in FIG. 2. The contact between spring portions 56 and 58 with the domed surfaces of levellers 60 and 62 provides even pressure from a single contact point with the spring. This pressure is controlled by the spring design and deflection and not by the arbitrary tightening of screw 80. By changing the thickness, hardness and deflection of the spring, any correct desired pressure can be repeatedly applied to the semi-conductor devices to maintain good heat transfer with the heat sink 16.

The domed surfaces of levellers 60 and 62 and the flat contacting surfaces of spring portions 56 and 58 assure that all of the clamping forces on the levellers are directed to the outer peripheries of the semi-conductor devices. The clamping pressure is distributed over the entire perimeter of each semi-conductor device rather than upon the single highest point first encountered when the clamp is tightened. This assures that the bottom surface of each semi-conductor device will be properly positioned against the heat sink. The result is maximum contact area between the lowest surface of each semi-conductor device and the heat sink to thereby maximize heat transfer to the heat sink. The uniformly distributed clamping force eliminates package cracking due to unbalanced loading.

The spacer 70 serves to assure that a proper spacing is maintained between the upper surface of the heat sink and the spring 50. The screw 80 is tightened down against the spacer. Consequently, the spring force exerted on the dome levellers 60 and 62 is uniform from assembly-to-assembly.

From the above description of the invention, those skilled in the art will perceive improvements, changes and modifications. Such improvements, changes and modifications within the skill of the art are intended to be covered by the appended claims.

Having described the invention, the following is claimed:

1. Apparatus for resiliently clamping semi-conductor means to a heat sink for receiving heat from said semi-conduction means and having an upper surface and wherein said semi-conductor means includes a housing having upper and lower spaced-apart relatively flat surfaces interconnected by an upstanding wall and comprising:

leveller means having an upper dome-shaped contact surface and a lower surface having a first recess formed therein, said first recess being shaped and being of sufficient size to receive the upper portion of a said housing including the upper surface thereof and a portion of the height of said upstanding wall while the lower surface of said housing is located on the upper surface of a said heat sink;

an elongated flat spring overlying and resiliently biased toward and engaging said dome-shaped contact surface of said leveller means for resiliently biasing said semi-conductor means against said heat sink;

fastening means for securing said spring to said heat sink such that said spring exerts a resilient force against the dome-shaped contact surface of said leveller to resiliently clamp said semi-conductor means against said upper surface of said heat sink; and wherein said first recess includes a second recess formed therein to define a shoulder therebetween which overlies the upstanding wall of said housing so that clamping resilient forces exerted by said spring are directed to said upstanding wall of said housing.

2. Apparatus as set forth in claim 1 wherein said fastening means includes a single screw extending vertically through said spring and into said heat sink.

3. Apparatus as set forth in claim 2 wherein said support is provided with a threaded hole for receiving said screw in threaded engagement therewith.

4. Apparatus for resiliently clamping semi-conductor means to a heat sink for receiving heat from said semi-conduction means and having an upper surface and wherein said semi-conductor means includes a housing having upper and lower spaced-apart relatively flat surfaces interconnected by an upstanding wall and comprising:

leveller means having an upper dome-shaped contact surface and a lower surface having a first recess formed therein, said first recess being shaped and being of sufficient size to receive the upper portion of a said housing including the upper surface thereof and a portion of the height of said upstanding wall while the lower surface of said housing is located on the upper surface of a said heat sink;

an elongated flat spring overlying and resiliently biased toward and engaging said dome-shaped contact surface of said leveller means for resiliently biasing said semi-conductor means against said heat sink;

fastening means for securing said spring to said heat sink such that said spring exerts a resilient force against the dome-shaped contact surface of said leveller to resiliently clamp said semi-conductor means against said upper surface of said heat sink;

said fastening means includes a single screw extending vertically through said spring and into said heat sink; and, spacer means interposed between the upper surface of said heat sink and said spring for spacing said spring a predetermined distance above said upper surface of said support.

5. Apparatus as set forth in claim 4 wherein said spacer means includes a bore through which said screw extends.

6. Apparatus as set forth in claim 5 wherein said first recess includes a second recess formed therein to define a shoulder therebetween which overlies the upstanding wall of said housing so that clamping resilient forces exerted by said spring are directed to said upstanding wall of said housing.

7. Apparatus as set forth in claim 5 wherein said heat sink is provided with a threaded aperture for receiving one end of said screw in threaded engagement therebetween so that said screw is tightened against said heat sink to hold said spring a predetermination distance from the upper surface of said heat sink.

8. Apparatus as set forth in claim 4 wherein said spring is an elongated, rectangular-shaped member having a hole extending therethrough mid-way between the opposite ends thereof for receiving said screw, said semi-conductor means including a first said housing and a second said housing spaced apart from each other and each having a said lower surface located on the upper surface of said heat sink and wherein said rectangular-shaped spring means has first and second portions which respectively overlie and contact the upper surfaces of said first and second housings.

9. Apparatus as set forth in claim 8, wherein said first and second portions of said spring are each flat.

* * * * *